US009870891B1

(12) United States Patent
Antipov et al.

(10) Patent No.: US 9,870,891 B1
(45) Date of Patent: Jan. 16, 2018

(54) HIGH GRADIENT PERMANENT MAGNET ELEMENTS FOR CHARGED PARTICLE BEAMLINES

(71) Applicant: Euclid Techlabs LLC, Gaithersburg, IL (US)

(72) Inventors: Sergey Antipov, Naperville, IL (US); Yingje Li, Lisle, IL (US); Chunuang Jing, Naperville, IL (US); Roman Kostin, Naperville, IL (US); Jiaqu Qiu, Willowbrook, IL (US); Dan Wang, Willowbrook, IL (US); Paul Schoessow, Willowbrook, IL (US)

(73) Assignee: EUCLID TECHLABS LLC, Solon, OH (US)

( * ) Notice: Subject to any disclaimer, the term of this patent is extended or adjusted under 35 U.S.C. 154(b) by 0 days.

(21) Appl. No.: 15/433,263

(22) Filed: Feb. 15, 2017

Related U.S. Application Data

(60) Provisional application No. 62/299,459, filed on Feb. 24, 2016.

(51) Int. Cl.
*H01J 37/14* (2006.01)
*H01J 37/26* (2006.01)
*H01J 1/50* (2006.01)
*H01F 7/02* (2006.01)

(52) U.S. Cl.
CPC .............. *H01J 1/50* (2013.01); *H01F 7/0284* (2013.01)

(58) Field of Classification Search
USPC ......... 335/92, 152, 153, 177, 209, 210, 229, 335/236, 237, 302, 304, 306; 250/396 R, 250/396 ML, 526; 313/440, 442
See application file for complete search history.

(56) References Cited

U.S. PATENT DOCUMENTS

| | | | | |
|---|---|---|---|---|
| 5,349,196 | A * | 9/1994 | Amemiya | H01J 37/3007 250/396 ML |
| 5,757,009 | A * | 5/1998 | Walstrom | G21K 1/093 250/396 ML |
| 6,498,348 | B2 * | 12/2002 | Aitken | H01J 37/05 250/396 ML |
| 9,343,261 | B2 * | 5/2016 | Chang | H01J 37/145 |
| 9,711,318 | B2 * | 7/2017 | White | H01J 27/14 |
| 9,728,931 | B2 * | 8/2017 | Nikipelov | H01S 3/0903 |
| 2002/0043621 | A1 * | 4/2002 | Aitken | H01J 37/05 250/281 |
| 2013/0264477 | A1 * | 10/2013 | Martin | H01J 3/22 250/307 |
| 2016/0042911 | A1 * | 2/2016 | Chang | H01J 37/145 250/311 |
| 2016/0301180 | A1 * | 10/2016 | Nikipelov | H01J 1/34 |
| 2017/0110282 | A1 * | 4/2017 | White | H01J 27/14 |

* cited by examiner

*Primary Examiner* — Bernard Souw
(74) *Attorney, Agent, or Firm* — John D Gugliotta

(57) ABSTRACT

The present invention provides a technique for constructing compact, high gradient magnetic lenses for charged particle beam focusing. Methods for adjusting the focusing strength of the lenses are provided, based on thermal control, mechanical motion of the magnetic chips within the yoke. The present invention is a method for designing and fabricating permanent magnet focusing elements that are compact, simple to construct, and having a large, adjustable focusing strength. Applications include beamlines for THz radiation sources, free electron lasers, wakefield accelerators and any other charged particle devices that require a compact beamline.

16 Claims, 3 Drawing Sheets

HIGH GRADIENT PERMANENT MAGNET ELEMENTS FOR CHARGED PARTICLE BEAMLINES

RELATED APPLICATIONS

There present application claims benefit of U.S. Provisional Application 62/299,459 filed on Feb. 24, 2016 and incorporated by reference as if fully rewritten herein.

BACKGROUND OF THE INVENTION

Technical Field of the Invention

The present invention is in the technical field of charged particle beam focusing, and in particular relates to compact permanent magnet based focusing and correction lenses capable of achieving high focusing strengths. The invention provides the means to develop beamlines for advanced rf sources and also for the control of beam instabilities in novel particle accelerators.

Description of the Related Art

Permanent magnets (PMs) in beam focusing devices have been in use for a number of years. The use of PMs eliminates the need for a current source to generate the magnetic field but can be inconvenient in terms of adjusting the magnetic field and hence the focusing properties of the lens on the fly. The most commonly used PM quadrupole is based on a design by Halbach, in which a number of wedge-shaped permanent magnets with magnetic axes oriented appropriately are assembled into a "pie" geometry with a beam aperture on center. Halbach quads require a relatively large amount of magnetic material, are complex to construct, and typically achieve a lower focusing strength than conventional quads.

A simpler design, suitable for high brightness beamlines, is needed. The principal application of this technology is the transport of high quality charged particle beams to an accelerating structure or energy extraction device. The compact longitudinal size of these magnetic lenses coupled with their high focusing strength allows the construction of FODO channels for beam breakup control, and new beamlines for pulse shaping and emittance exchange.

The invention presented here effectively shows a method for constructing high field gradient magnetic focusing lenses for charged particle beams by embedding mall chips of permanent magnet material in a support structure.

Further, the field shape can be selected by appropriate positioning and shaping of the PM chips to produce 2n-pole focusing fields.

Further, the field gradient in the lenses can be adjusted by a number of suggested techniques: thermal, mechanical etc.

Further, the lenses may be stacked to forma a short wavelength focusing channel that can be used to control instabilities in charged particle beams.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

The present invention is a technique for producing magnetic focusing lenses that are manufacturable, inexpensive, and enable the design of compact beamlines.

SUMMARY OF THE INVENTION

Briefly described according to a broad embodiment of the present invention, this technology is a technique for constructing compact, high gradient magnetic lenses for charged particle beam focusing. Methods for adjusting the focusing strength of the lenses are provided, based on thermal control, mechanical motion of the magnetic chips within the yoke. A simple, efficient, and inexpensive apparatus is presented to focus and correct aberrations in charged particle beams using permanent magnets inserted into a supporting structure which also holds the configuration of the PMs fixed against their mutual repulsion or attraction. The use of a novel configuration of permanent magnet slabs allows for a more compact device with high 2n-pole field uniformity and high focusing strength compared to conventional (Hallbach) permanent magnet focusing elements. Methods for tuning or stabilizing the magnetic fields that are presented include: thermal control; addition of ferromagnetic shims to the device; using a piezoelectric actuator or other linear motor to deform the support structure otherwise change the position of the PMs; using an adjustable iris; adjusting the axial (longitudinal) offset of the focusing device with respect to the other elements in a beamline; or any combination of these methods.

The use of multiple PM elements comprising a beam channel is also presented: a device consisting of alternating focusing and defocusing magnetic quadrupole lenses (FODO) surrounding an accelerating structure used to suppress beam breakup instabilities; a matching beamline to focus beam from an injector into an accelerating structure.

The present invention is a method for designing and fabricating permanent magnet focusing elements that are compact, simple to construct, and having a large, adjustable focusing strength. Applications include beamlines for THz radiation sources, free electron lasers, wakefield accelerators and any other charged particle devices that require a compact beamline.

Further objects, features, aspects and advantages will become apparent in the course of the following description.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

DESCRIPTION OF THE PREFERRED EMBODIMENTS

The best mode for carrying out the invention is presented in terms of its preferred embodiment, herein depicted within the Figures. It should be understood that the legal scope of the description is defined by the words of the claims set forth at the end of this patent and that the detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

The best mode for carrying out the invention is presented in terms of its preferred embodiment herein depicted within the Figures.

1. DETAILED DESCRIPTION OF THE FIGURES

Referring now to the Figures, the present invention provides a low-cost method of producing high gradient compact magnetic multipole lenses. According to the present invention use of these lenses provide the capability of efficiently transporting a charged particle beam with desired characteristics. As shown in reference to FIG. 1, a quadrupole beamline magnet is comprised of four identical permanent magnetic blocks (PMB) with rectangular or square cross-section (A). The PMBs are transversely shifted with respect to each other consecutively with a given order. Then the interfacing surfaces between each pair of the neighboring PMBs overlap partly forming a square working space with much smaller transverse dimension than that of the PMBs themselves (B). The configurations of the easy axes of the four PMBs can be made flexible to obtain different strengths and orientations of the quadrupole field.

Figure 1:
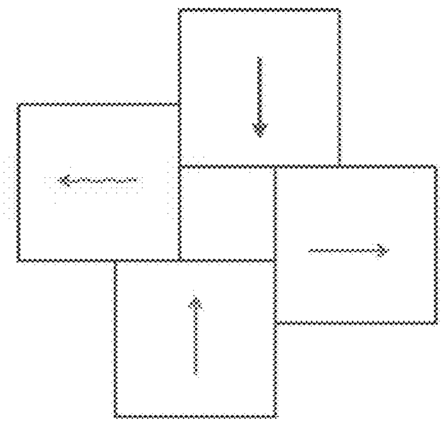
FIG. 1 depicts the principle of the compact quadrupole lens.
Figure 2:
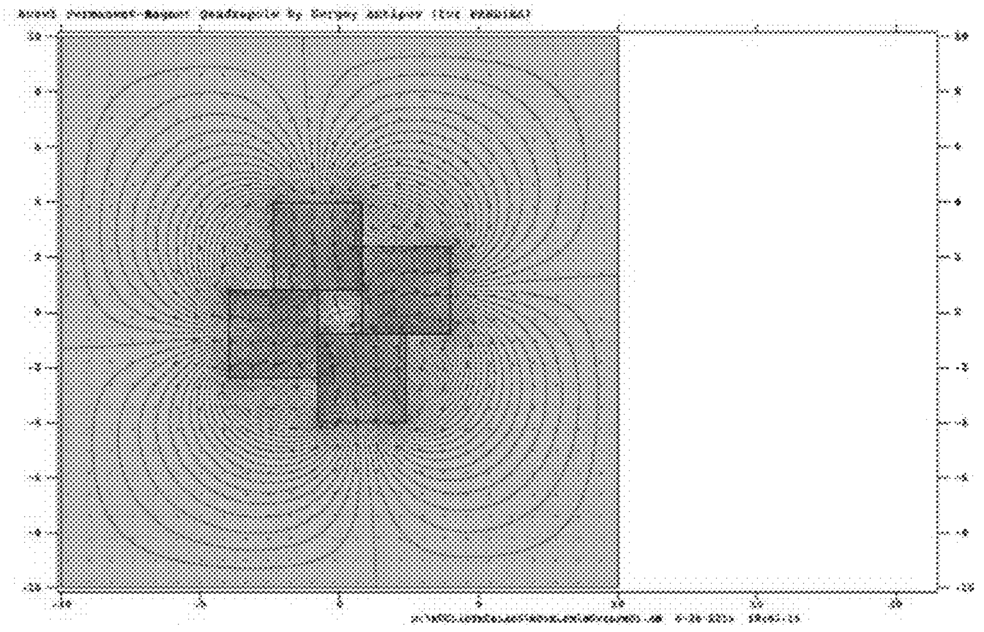
FIG. 2. shows the calculated fields in the lens of FIG. 1.

FIG. 2 shows the results of a numerical calculation of the fields in a compact quadrupole similar to that shown in FIG. 1. The characteristic quadrupole shape of the field lines in the central beam aperture is apparent.

Figure 3:
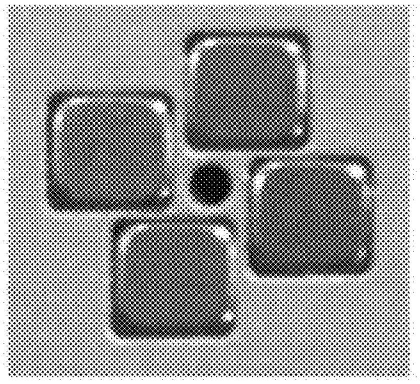
FIG. 3 is a photograph of a quadrupole prototype, with magnetic chips oriented according to FIG. 1 in a support yoke.

FIG. 3 is a photograph of an example of a manufactured quadrupole prototype, with PMBs oriented according to FIG. 1 in an aluminum support yoke. Legend: A: PMBs; B: beamline aperture; C: support yoke.

Figure 4:
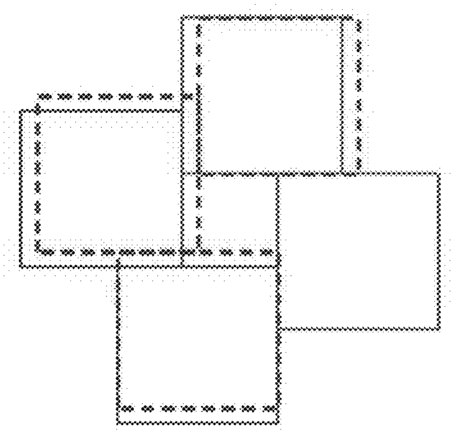
FIG. 4 shows a method for tuning compact PM quadrupole by displacement of PM chips within the support yoke. The displacement may be done using mechanical actuators or by temperature changes.

FIG. 4 shows a method for tuning compact PM quadrupole by small displacements of the PM chips within the support yoke. The displacement may be done using mechanical actuators or by temperature changes. Solid lines show initial positions of the PMBs, and dashed lines the final positions.

Figure 5:
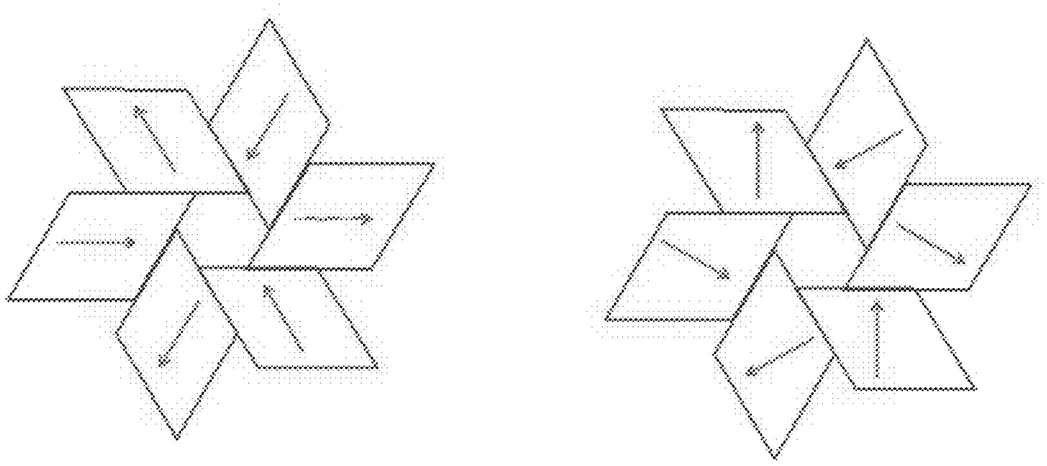
FIG. 5 shows two possible permanent magnet configurations for a compact PM sextupole.

FIG. 5 shows two possible permanent magnet configurations for a compact PM sextupole. A sextupole beamline magnet consists of six identical permanent magnetic blocks (PMBs) with diamond-shaped or triangular cross-section. The PMBs are transversely shifted with each other consecutively with a given order, analogous to the quadrupole of claims 1-2. The interfacing surfaces between each pair of neighboring PMBs overlap partly forming a hexagon-shaped beam aperture with much smaller transverse dimension than that of the PMBs themselves. The configurations of the easy axis of the six PMBs can be made flexible to obtain different strengths and orientations of the sextupole field.

Figure 6:
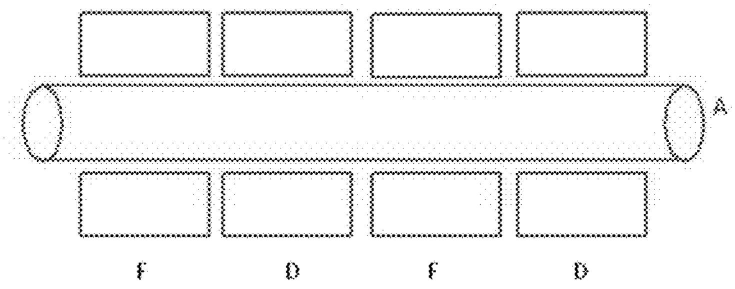
FIG. 6 shows a section of periodic focusing-defocusing beamline for beam transport and beam breakup control.

FIG. 6 shows a section of periodic focusing-defocusing beamline for beam transport and beam breakup control. Use of a short period FODO channel (consisting of many periods of focusing-drift-defocusing-drift elements) can correct for beam breakup caused by injection errors of a high intensity beam. Previous approaches to this problem were unsuccessful because of the lack of compact high field quadrupoles like those presented in this disclosure.

2. OPERATION OF THE PREFERRED EMBODIMENT

Current low emittance electron beam technology could benefit greatly from the minimal aperture magnetic lenses with extremely high gradients (focusing fields). The strength of the quadrupole depends on the aperture size but can reach incredible gradients of 1 T/mm for a 0.5 mm aperture.

The application of this technology is in electron beam transport and focusing for compact mm, sub-mm and THz frequency range devices, and for accelerator based beams for high energy physics research. In a accordance with a preferred embodiment, the aim of said invention is to enable transport and control of submicron electron beams.

The foregoing descriptions of specific embodiments of the present invention are presented for purposes of illustration and description. They are not intended to be exhaustive nor to limit the invention to precise forms disclosed and, obviously, many modifications and variations are possible in light of the above teaching. The embodiments are chosen and described in order to best explain principles of the invention and its practical application, to thereby enable others skilled in the art to best utilize the invention and its various embodiments with various modifications as are suited to the particular use contemplated. It is intended that a scope of the invention be defined broadly by the Drawings and Specification appended hereto and to their equivalents. Therefore, the scope of the invention is in no way to be limited only by any adverse inference under the rulings of *Warner-Jenkinson Company, v. Hilton Davis Chemical,* 520 US 17 (1997) or *Fosto Corp. v. Shoketsu Kinzoku Kogyo kabushiki Co.,* 535 U.S. 722 (2002), or other similar caselaw or subsequent precedent should not be made if any future claims are added or amended subsequent to this patent application.

Having thus described the invention, what is claimed as new and desired to be secured by Letters Patent is as follows:

1. A compact permanent magnet quadrupole lens for charged particle beam focusing comprised of four identical permanent magnetic blocks (PMB) with rectangular or square cross-sections mounted in a supporting structure.

2. The compact permanent magnet quadrupole lens for charged particle beam focusing of claim 1, wherein a particular set of configurations and magnetic axis orientations of the four PMBs in the support structure are utilizes that forms a rectangular aperture in which a quadrupole magnetic field is produced, and through which a vacuum chamber transporting a charged particle beam can be inserted.

3. A compact permanent magnet sextupole lens for charged particle beam focusing comprised of six identical permanent magnetic blocks (PMBs) with diamond-shaped or triangular cross-sections mounted in a supporting structure.

4. The compact permanent magnet sextupole lens for charged particle beam focusing of claim 3, wherein a particular set of configurations and magnetic axis orientations of the six PMBs in the support structure that forms a hexagonal aperture in which a sextupole magnetic field is produced, and through which a vacuum chamber transporting a charged particle beam can be inserted.

5. A compact permanent magnet multipole lens for charged particle beam focusing comprised of a plurality of multipole beamline magnetic blocks mounted in a supporting structure, wherein the quantity of magnets comprises 2n-poles and the total number of poles is an integer greater than 4.

6. A method of mounting and configuring PMs in non-magnetic supports to obtain different 2n-pole elements as described in claim 5, wherein a non-magnetic metal (e.g. Aluminum) support can be used to clamp and fasten the permanent magnets used in the lens, said support having an inner geometry matching an outer geometry of the PMBs and a symmetric outer geometry that can be easily machined as a single piece or assembled from separate parts such that the multipole magnet assembly can be easily mounted in the support.

7. Method for thermal stabilization of the magnetic field inside the beam aperture, in which materials with expansion coefficients different from the PMBs and the support structure are attached to the outer surfaces of the PMBs in the multipole beamline magnets in claim 5, to compensate for aperture field variations caused by temperature changes.

8. Method of adjusting the aperture field using thermal control, in which the magnetic field strength of the multipole beamline magnets in claim 5 can be tuned by changing the temperature of the magnet 7.

9. A method of adjusting the aperture field using tuning shims wherein said tuning shims are made of ferromagnetic materials can be applied to the inner surfaces of the PMBs facing the working space in claim 5 to fine-tune the field strength and distribution.

10. A method of adjusting the magnetic center of the aperture field using a piezoelectric or other high precision mechanical actuator in the magnetic lenses described in claim 5, the magnetic center in the transverse plane with respect to the beam axis can be adjusted by using a pair of mechanical actuators where the direction of the forces exerted are orthogonal.

11. A method of adjusting the aperture field using piezoelectric or other high precision mechanical actuatorin the magnetic lenses described in claim 5 the magnetic field in the beam aperture can be adjusted by using mechanical actuators to deform the support structure or change the positions of the PMBs.

12. A field adjustment using a mechanical iris mounted at the magnet aperture of claim 5, wherein the tuning of the magnetic field strength of the multipole beamline magnets can be realized by a mechanism similar to an iris diaphragm but constructed from a ferromagnetic material, such that changing the aperture of the diaphragm also varies the magnetic field.

13. A beam channel consisting of alternate defocusing-focusing PM lenses as in claim 5 surrounding an accelerating structure to suppress beam breakup caused by parasitic higher order modes.

14. Tuning a beam channel as in claim 13 by moving PM lenses axially with respect to other beamline elements using actuators.

15. Use of micro PM quad focusing to efficiently transmit a charged particle beam from a thermionic or photocathode source into an accelerating structure.

16. Hybrid permanent magnets for use in conjunction with claim 5, said hybrid permanent magnets consisting of:

a combination of ferromagnetic poles and PMBs can also be realized;

multiple ferromagnetic poles (e.g., low carbon iron) with large transverse dimensions and partly overlapping interfacing surfaces form an aperture with a small transverse dimension; and multiple PMBs attached to the outer surfaces of the poles with respect to the beam axis provide the magnetomotive force.

* * * * *